United States Patent

[11] 3,603,975

[72] Inventor Bernard M. Gordon
Magnolia, Mass.

[21] Appl. No. 811,781
[22] Filed Apr. 1, 1969
[45] Patented Sept. 7, 1971
[73] Assignee Gordon Engineering Company
Watertown, Mass.

[54] DEVICE FOR ANALOG TO DIGITAL CONVERSION OR DIGITAL TO ANALOG CONVERSION

9 Claims, 3 Drawing Figs.

[52] U.S. Cl. 340/347 AD
[51] Int. Cl. H03k 13/06
[50] Field of Search 340/347; 235/150.5

[56] References Cited

UNITED STATES PATENTS

| | | | |
|---|---|---|---|
| 3,438,024 | 4/1969 | Smith | 340/347 |
| 3,453,615 | 7/1969 | Scott | 340/347 |
| 3,484,589 | 12/1969 | Jernakoff | 235/150.5 |
| 3,505,668 | 4/1970 | Ottesen | 340/347 |

*Primary Examiner*—Daryl W. Cook
*Assistant Examiner*—Jeremiah Glassman
*Attorney*—Morse, Altman & Oates

ABSTRACT: In a successive approximation for converting analog data to digital form or digital data to analog form, the logically programmed sequence is switched at ground potential in order to eliminate transients of the type usually introduced by switching. In order to ensure great conversion accuracy, a voltage source is provided for generating precision reference signals that are extremely unresponsive to input voltage fluctuations.

INVENTOR.
Bernard M. Gordon
BY
Morse, Altman & Oates
ATTORNEYS

PATENTED SEP 7 1971 3,603,975

SHEET 2 OF 3

INVENTOR.
Bernard M. Gordon
BY
Morse, Altman & Oates
ATTORNEYS

INVENTOR.
Bernard M. Gordon
BY
Morse, Altman & Oates
ATTORNEYS

DEVICE FOR ANALOG TO DIGITAL CONVERSION OR DIGITAL TO ANALOG CONVERSION

BACKGROUND AND SUMMARY

The present invention relates to both analog-to-digital and digital-to-analog converters, and more particularly to data form converters employing the successive approximation technique. In the successive approximation technique, analog-to-digital or digital-to-analog conversion is accomplished by switching, in a logically programmed sequence, a reference voltage with respect to a resistive divider network to provide for comparison between reference signal increments and input data signal increments. Such systems have suffered from transients, which have been introduced as a result of the switching, and from the necessity for interface circuitry, which has permitted the switching to occur at a reference potential.

A primary object of the present invention is to provide, in both analog-to-digital and digital-to-analog converters, a novel successive approximation technique involving switching at ground potential in a logically programmed sequence rather than switching a reference voltage in such a sequence, whereby the transients are avoided and the interface circuitry is minimized. Another object of the present invention is to provide a precision reference voltage source, characterized by a novel operational amplifier arrangement that renders the output voltages extremely unresponsive to input voltage fluctuations.

The invention accordingly comprises the apparatus possessing the construction, combination of elements, and arrangement of parts that are exemplified in the following detailed disclosure, the scope of which will be indicated in the appended claims.

BRIEF DESCRIPTION OF DRAWINGS

For a fuller understanding of the nature and objects of the present invention, reference should be had to the following detailed description taken in connection with the accompanying drawings wherein.

DETAILED DESCRIPTION

Figure 1:
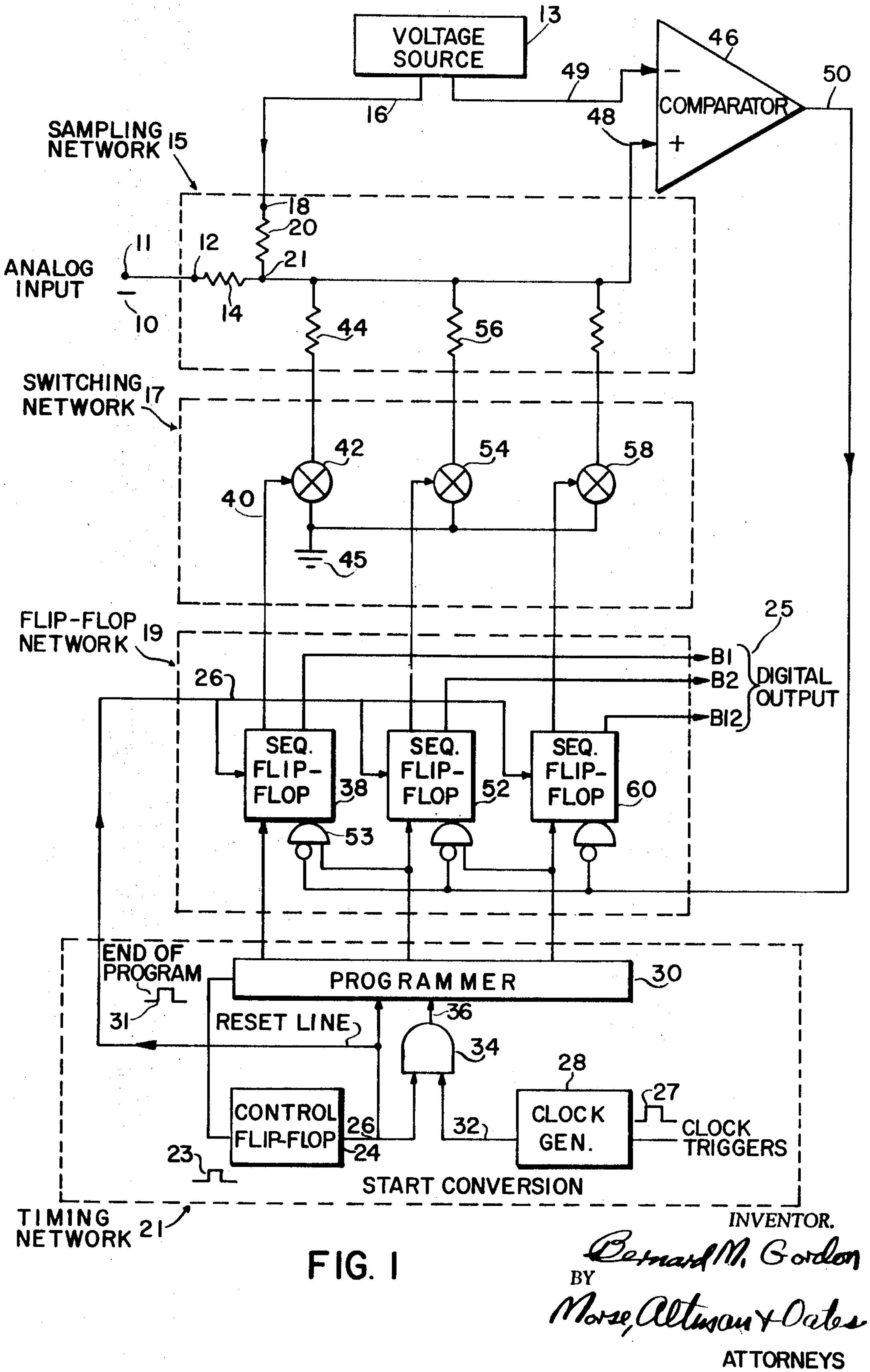
FIG. 1 is a block and schematic diagram of an analog-to-digital converter embodying the present invention.

Generally, the analog-to-digital system of FIG. 1 comprises an input terminal 11 for receiving an analog signal, a voltage source 13 for supplying precision reference voltages, a sampling network 15 including a sequence of precision resistors, a switching network 17 including a plurality of switching devices for controlling current flow through the precision resistors to a ground potential 45, a flip-flop network 19 including a plurality of sequential flip-flops for controlling the state of each of the switching devices, a timing network 21 for controlling the sequential flip-flops, a comparator 46 for comparing a reference voltage with voltages established by current flow through the sampling network, and output terminals 25 for presenting a digital signal. In the following discussion, for convenience, a switching device will be designated in the conducting state when its correlative sequential flip-flop is in state ONE and will be designated in the nonconducting state when its correlative sequential flip-flop is in state ZERO.

In the device of FIG. 1, 12 comparisons, i.e., decisions, are required for each complete conversion. A decision involves passing a current through a switching device by triggering the appropriate sequential flip-flop to state ONE in response to one of a sequence of program pulses and then either allowing this current to continue to pass through the switching device or returning the switching device to the nonconducting state, depending upon the signal appearing at an input 48 to comparator 46. If it is specified that the switching device be returned to the nonconducting state, a reject pulse 50 is generated by comparator 46 simultaneously with the next program pulse, and the same flip-flop is retriggered to state ZERO. The final state of each sequential flip-flop represents the analog signal in digital form. In the illustrated converter of FIG. 1, there are 12 sequential flip-flops. It will be understood that in alternative embodiments, the number of sequential flip-flops in other than 12, for example, 16.

The final states of the aforementioned 12 sequential flip-flops are produced as follows. The operation of digitizing one of a series of quasi-instantaneous samples of analog input voltage 10 is initiated by a start trigger 23, which triggers control flip-flop 24 to the ONE state. An output 26 of control flip-flop 24 resets the sequential flip-flops to state ZERO. Also, clock triggers 27 are applied to a clock generator 28. An output 32 of clock generator 28 and output 26 of control flip-flop 24 are applied to a logic circuit 34. An output 36 of logic circuit 34 is applied to a programmer 30, which generates a series of program pulses. For convenience, the program will be consecutively designated, as program pulse 01, program pulse 02, etc. Program pulse 01 is applied to the first sequential flip-flop 38, which having been triggered to state ZERO by reset pulse 26, now is triggered to state ONE. Sequential flip-flop 38, having been triggered to state ONE by program pulse 01, causes a switching device 42 to change from the nonconducting state to the conducting state, thereby allowing current to flow through a resistor 44 to a ground potential 45. The difference between (1) the sum of the current from a reference voltage 16 and analog voltage 10 and (2) the precision current through switching device 42 is applied to a summing bus 48 at the input to comparator 46. When the input voltage at summing bus 48 is equal to or more positive than a reference voltage 49, an accept pulse is generated from comparator 46 for application to the sequential flip-flops. When the input voltage at summing but 48 is negative with respect to the reference voltage 49, a reject pulse is generated from comparator 46 to the sequential flip-flops. Program pulse 02 is applied to the second sequential flip-flop 52, which having been triggered to state ZERO by reset pulse 26, now is triggered to state ONE. Program pulse 02 is also applied to a logic circuit 53, associated with the sequential flip-flop 38. Application of both the reject signal from comparator 46 and program pulse 02 to logic circuit 53 resets sequential flip-flop 38 to state ZERO. If an accept signal is generated from comparator 46, sequential flip-flop 38 remains in state ONE. The conversion is terminated when a program terminate pulse 31, for example from programmer 30, is applied to control flip-flop 24. Program terminate pulse 31 is generated from programmer 30 either when the voltage at summing bus 48 is equal to the reference voltage 49 or when program pulse 012, for example, is applied to the 12th sequential flip-flop 60. The final state of each sequential flip-flop represents 1 bit of a digital signal, which delineates the analog voltage in digital form.

Figure 2:
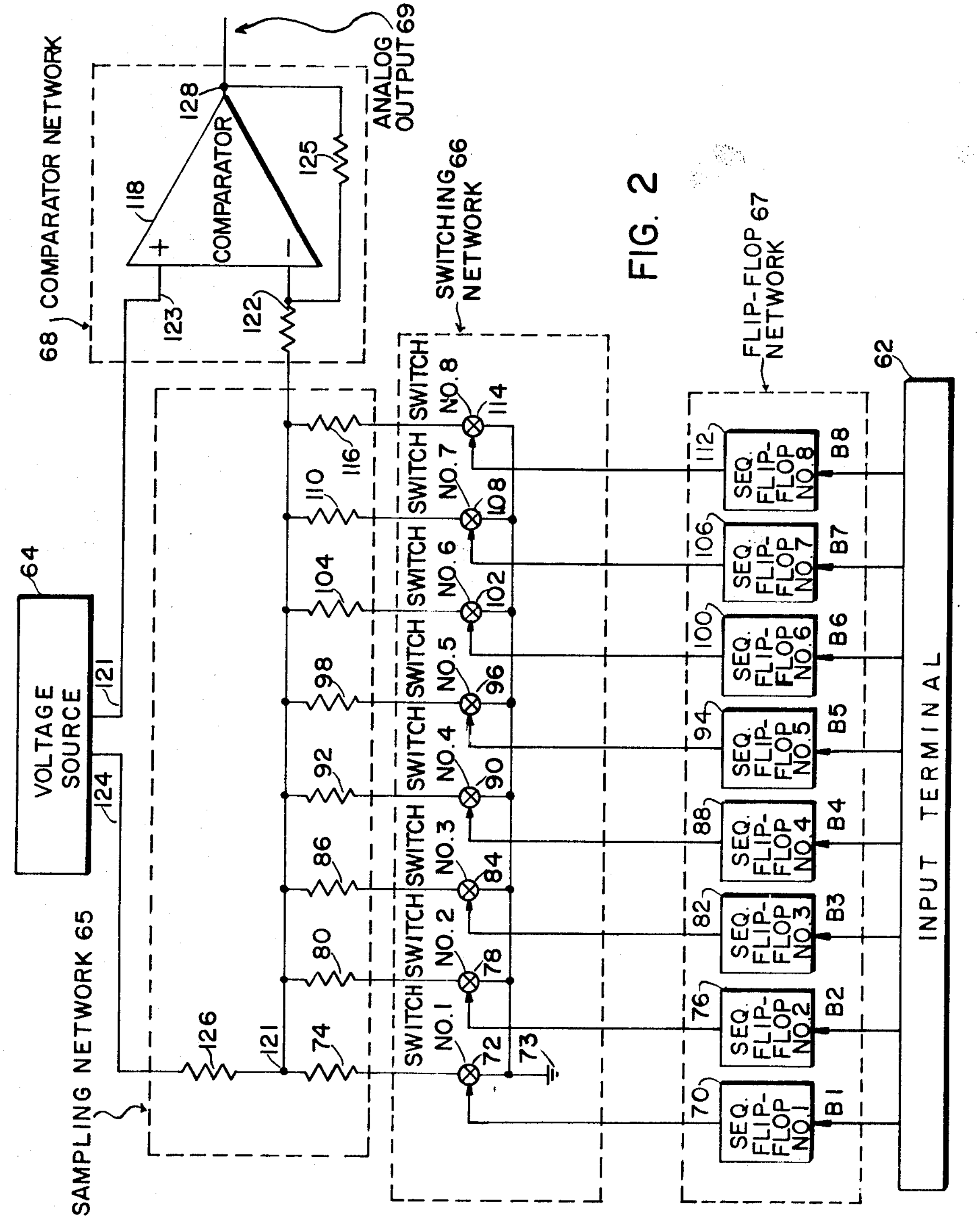
FIG. 2 is a block and schematic diagram of a digital-to-analog converter embodying the present invention.

FIG. 2 illustrates an 8-bit digital-to-analog converter. Generally, the converter comprises an input terminal 62 for receiving a digital signal, a voltage source 64 for supply reference voltage, a sampling network 65 containing a sequence of precision voltage components, for example, precision resistors, a switching network 66 comprising a plurality of switching devices for controlling current flow through the precision resistors to a ground potential 73, a flip-flop network 67 containing a plurality of sequential flip-flops for controlling the state of the switching device, a comparator network 68 for comparing the current flow through the sampling network with that establishing a reference voltage 121, and an output terminal 69 for presenting the digital signal as an analog signal. In the illustrated converter there are 8 sequential flip-flops. It will be understood that in alternative embodiments the number of sequential flip-flops is other than 8, for example, 12.

In the device of FIG. 2, a digital signal is applied at 63 to input terminal 62. The digital signal from the input terminal 62 is applied to a sequence of flip-flops 70, 76, 82, 88, 94, 100, 106, and 112, each sequential flip-flop receiving 1 bit of the digital signal. The state of a sequential flip-flop is determined by the digital bit applied to that flip-flop, i.e., a flip-flop is designated state ONE if its corresponding digital bit is ONE and is designated state ZERO if its corresponding digital bit is ZERO. Associated with and controlled by sequential flip-flops 70, 76, 82, 88, 94, 100, 106 and 112 are switching devices 72, 78, 84, 90, 96, 102, 108 and 114, respectively. A switching device is designated as being in the conducting state when its correlative sequential flip-flop is in state ONE and is designated as being in the nonconducting state when its correlative sequential flip-flop is in state ZERO. Each of switching devices 72, 78, 84, 90, 96, 102, 108 and 144 is connected to one of precision resistors 74, 80, 86, 92, 98, 104, 110 and 116. A predetermined voltage level (a reference voltage 124 less the voltage drop across a resistor 126) is applied to a junction 121, the union of the precision resistors. When a switching device is in the conducting state, a predetermined current is permitted to flow from the junction 121 through the corresponding precision resistor to ground potential 73. The value of each precision resistor is so weighted that the current through each contributes to a voltage applied at a summing bus 122 in proportion to its value. A comparator 118, for example a closed loop operational amplifier, compares the voltage at summing bus 122 with the reference voltage applied as at 123 via a feedback resistor 125. That is, a current flows from a junction 120 at the output of the comparator through the feedback resistor 125 to summing bus 122 until the voltage as at 122 is equal to the voltage as at 123. Hence, the voltage at the output 69 of the comparator 118 is proportional to the voltage at summing bus 122. As previously stated, the voltage at summing bus 122 is dependent upon the current through precision resistors 74, 80, 86, 92, 98, 104, 110 and 116. Therefore, the voltage at output 69 represents the digital signal in analog form.

Figure 3:
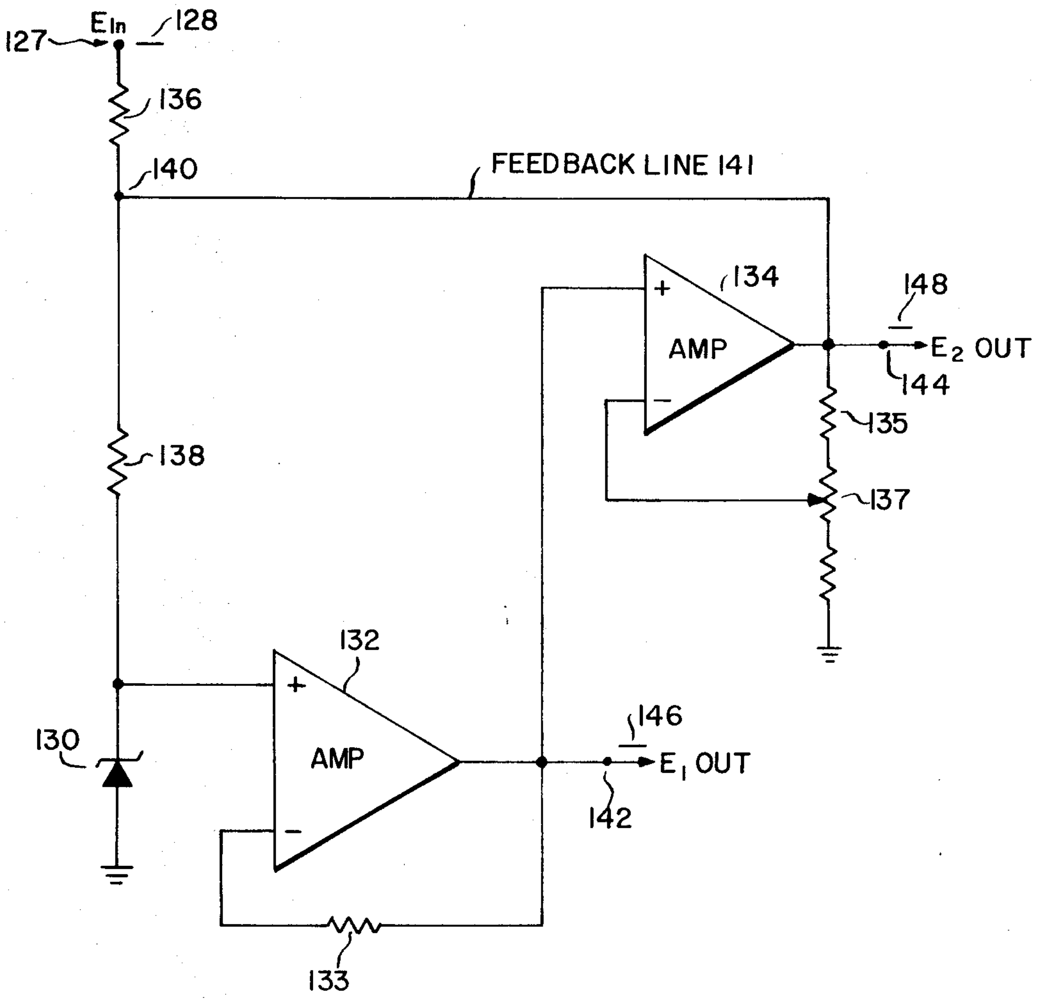
FIG. 3 is a schematic diagram of a reference voltage source that is particularly applicable to the converters FIG. 1 and FIG. 2.

FIG. 3 is a schematic diagram of the voltage source hereinbefore mentioned in the discussion of FIGS. 1 and 2. In general, this voltage source comprises an input terminal 127 for receiving an external voltage, two operational amplifiers 132 and 134 for generating reference voltages 146 and 148 respectively, a voltage-referencing device 130 for applying a relatively constant voltage to the operational amplifier 132, a feedback line 141 for stabilizing the voltage applied to the voltage-referencing device, and two output terminals 142 and 144 for presenting the output voltage of the operational amplifiers. In one example, the external voltage 128 applied at terminal 127 if 15 volts, the voltage-referencing device 130 is a 5-volt zener diode, the gain of operational amplifier 132 is 1, and the gain of operational amplifier 134 is 2.

The external voltage 128 is applied to the cathode of zener diode 130. Due to the operation of the zener diode, the voltage at a junction 131 remains at 5 volts plus or minus the operating tolerance of the zener diode. The voltage as at 131 is applied to operational amplifier 132. The 5-volt output 146 of operational amplifier 132, stabilized by the feedback resistor 133, is applied to the input of operational amplifier 134. The 10-volt output 148 of operational amplifier 134, stabilized by the feedback resistors 135 and 137, is applied via negative feedback line 141 as a negative feedback current to a junction 140 between input resistors 136 and 138. This negative feedback current tends to stabilize the voltage at the cathode of the zener diode. That is in the foregoing example, if the external voltage is increased beyond 15 volts, a negative feedback current from the operational amplifier 134 contributes to the voltage at junction 140 in such a manner as to offset the increase in the external voltage. Hence, the voltage applied to the cathode of zener diode 130 is further controlled by the stability of operational amplifier 134. A typical stability factor for an output reference voltage using the circuit of the present invention is 3 microvolts/volt, i.e., the reference voltages 146 and 148 will change 3 microvolts for each 1 volt change in input voltage.

Since certain changes may be made in the foregoing disclosure without departing from the scope of the invention herein involved, it is intended that all matter contained in the above description and shown in the accompanying drawings be construed in an illustrative and not in a limiting sense.

What is claimed is:

1. A device for data conversion between analog form and digital form, said device comprising:
   a. voltage source means for providing a reference voltage;
   b. a plurality of precision voltage component means through which currents are defined, said currents being related to an input signal, each of said voltage component means having first and second terminal means, each of said voltage component first terminal means operatively connected to said voltage source means;
   c. a series of switching means having at least first and second terminal means, one each of said switching first terminal means operatively connected to one each of said voltage component second terminal means, each of said switching second terminal means connected to ground potential, each said switching means having ON and OFF states, said switching first terminal means operatively connected to said switching second terminal means when said switching means are in the ON state, said switching first terminal means operatively disconnected from said switching second terminal means when said switching means are in the OFF state, current flowing through selected ones of said voltage component means to said ground potential via selected switching means in the ON state;
   d. means operatively connected to said switching means for controlling the ON and OFF states of each said switching means; and
   e. comparator means having at least first, second, and output terminal means, said comparator first terminal means operatively connected to said voltage source means, said comparator second terminal means operatively connected to each said voltage component first terminal means.

2. The device as claimed in claim 1 wherein the data conversion is from analog form to digital form, said means for controlling including:
   a. a series of sequential flip-flop means, one each of said flip-flop means operatively connected to one each of said switching means and to said comparator means, each said sequence flip-flop means having first and second states; and
   b. timing means operatively connected to each said sequential flip-flop means for selectively controlling the states of each said sequential flip-flop means, the final state of each said sequential flip-flop means representing an input analog signal in digital form.

3. The device as claimed in claim 1 wherein the data conversion is from digital form to analog form, said means for controlling including a series of sequential flip-flop means, one each of said sequential flip-flop means operatively connected to one each of said switching means for governing the state of said switching means, a signal in digital form being selectively applied to each said sequential flip-flop means; an analog form of said digital signal being presented at said output terminal means of said comparator means.

4. The device of claim 2, wherein said timing means includes:
   a. control flip-flop means for initiating a conversion by said device;
   b. clock means for generating a sequence of predeterminately timed clock pulses; and
   c. programmer means operatively connected to said control flip-flop means, clock means, and sequential flip-flop means for generating a sequence of program pulse responsive to said clock pulses for sequentially triggering said sequential flip-flop means into said second state.

5. The device of claim 2, wherein said comparator means includes:

a. accept means for generating accept pulses;

b. reject means for generating reject pulses for triggering said sequential flip-flop means triggered into said second state by said programmer means into said first state.

6. A device for data conversion from analog form to digital form, said device comprising:

a. input means for receiving an analog signal;

b. voltage source means for providing a reference operatively connected to said input means;

c. a plurality of precision voltage component means through which currents are defined, said currents being related to said analog signal, each of said voltage component means having first and second terminal means, each of said voltage component first terminal means operatively connected to said voltage source means;

d. a series of switching means having at least first and second terminal means, one each of said switching first terminal means operatively connected to one each of said voltage component second terminal means, each of said switching second terminal means connected to ground potential, each said switching means having ON and OFF states, said switching first terminal means operatively connected to said switching second terminal means when said switching means are in the ON state, said switching first terminal means operatively disconnected from said switching second terminal means when said switching means are in the OFF state, current flowing through selected ones of said voltage component means to said ground potential via selected switching means in the ON state;

e. means operatively connected to said switching means for controlling the ON and OFF states of each said switching means; and f. comparator means having at least first, second, and output terminal means, said comparator first terminal means operatively connected to said voltage source means, said comparator second terminal means operatively connected to each said voltage component means, and said comparator output terminal means operatively connected to said means for controlling.

7. A device for data conversion from digital form to analog form, said device comprising:

a. input means for receiving a digital signal;

b. voltage source means for providing a reference voltage;

c. a plurality of precision voltage component means through which currents are defined, said currents being related to said digital signal, each of said voltage component means having first and second terminal means, each of said voltage component first terminal means operatively connected to said voltage source means;

d. a series of switching means having at least first and second terminal means, one each of said switching first terminal means operatively connected to one each of said voltage component second terminal means, each of said switching second terminal means connected to ground potential, each said switching means having ON and OFF states, said switching first terminal means operatively connected to said switching second terminal means when said switching means are in the ON state, said switching first terminal means operatively disconnected from said switching second terminal means when said switching means are in the OFF state, current flowing through selected ones of said voltage component means to said ground potential via selected switching means in the ON state;

e. means operatively connected between said input means and said digital signals applied to said means for controlling and said means for controlling selectively triggering said switching means into the ON and OFF states; and f. comparator means having at least first, second, and output terminal means, said comparator first terminal means operatively connected to said voltage source means, said comparator second terminal means operatively connected to each said voltage component means.

8. The device as claimed in claim 1 wherein said voltage source means includes:

a. input means having terminal means for receiving a signal from an external voltage source and b. stabilizer means having at least first and second amplifier means; said first and second amplifier means connected in stages, each said first and second amplifier means having input and output terminal means, said first amplifier input terminal means operativelv connected to said input means, said first amplifier output terminal means operatively connected to said second amplifier input terminal means, said second amplifier means operatively connected to said first amplifier input terminal means as a negative feedback, the stability of said second amplifier means operating to stabilize the voltage at said first amplifier input means.

9. The device as claimed in claim 8 wherein said input means includes reference voltage means operatively connected between said input terminal means and ground potential for maintaining the signal at said input terminal means at a constant level.